US010726169B2

(12) United States Patent
Adel et al.

(10) Patent No.: US 10,726,169 B2
(45) Date of Patent: Jul. 28, 2020

(54) TARGET AND PROCESS SENSITIVITY ANALYSIS TO REQUIREMENTS

(71) Applicant: KLA-Tencor Corporation, Milpitas, CA (US)

(72) Inventors: Michael E. Adel, Ya'akov Zichron (IL); Nuriel Amir, St. Yokne'am (IL); Mark Ghinovker, Yoqneam Ilit (IL); Tal Shusterman, Haifa (IL); David Gready, Tel Aviv (IL); Sergey Borodyansky, Sunnyvale, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 525 days.

(21) Appl. No.: 14/919,954

(22) Filed: Oct. 22, 2015

(65) Prior Publication Data
US 2016/0042105 A1 Feb. 11, 2016

Related U.S. Application Data

(63) Continuation of application No. PCT/US2014/069617, filed on Dec. 10, 2014.
(Continued)

(51) Int. Cl.
*G06F 30/20* (2020.01)
(52) U.S. Cl.
CPC ................... *G06F 30/20* (2020.01)
(58) Field of Classification Search
CPC ................................. G06F 17/5009
See application file for complete search history.

(56) References Cited

U.S. PATENT DOCUMENTS 6,834,213 B1 12/2004 Sonderman et al.
2003/0187604 A1 10/2003 Drege et al.
(Continued)

FOREIGN PATENT DOCUMENTS

CN 1672012 A 9/2005
JP 06-332976 A 12/1994
(Continued)

OTHER PUBLICATIONS

Rosenthal, Frank et al., "Drift Aware Ensemble Regression," In: Proceedings of the 6th International Conference on Machine Learning and Data Mining in Pattern Recognition, pp. 221 235, 2009. See p. 223.
(Continued)

*Primary Examiner* — Aniss Chad
(74) *Attorney, Agent, or Firm* — Suiter Swantz pc llo

(57) ABSTRACT

Systems and method are provided for analyzing target, process and metrology configuration sensitivities to a wide range of parameters, according to external requirements or inner development and verification needs. Systems comprise the following elements. An input module is arranged to receive parameters relating to targets, target metrology conditions and production processes, to generate target data. A metrology simulation unit is arranged to simulate metrology measurements of targets from the target data and to generate multiple metrics that quantify the simulated target measurements. A sensitivity analysis module is arranged to derive functional dependencies of the metrics on the parameters and to define required uncertainties of the parameters with respect to the derived functional dependencies. Finally, a target optimization module is arranged to rank targets and target metrology conditions with respect to the simulated target measurements.

17 Claims, 9 Drawing Sheets

Related U.S. Application Data

(60) Provisional application No. 61/914,950, filed on Dec. 11, 2013.

(56) References Cited

U.S. PATENT DOCUMENTS

| | | | |
|---|---|---|---|
| 2006/0290947 A1* | 12/2006 | Li ......................... | G01B 11/24 356/625 |
| 2007/0276634 A1 | 11/2007 | Smith et al. | |
| 2010/0175033 A1* | 7/2010 | Adel ..................... | G03F 7/705 716/52 |
| 2015/0185625 A1* | 7/2015 | Chen .................. | G03F 7/70633 702/182 |

FOREIGN PATENT DOCUMENTS

| | | |
|---|---|---|
| TW | 490555 B | 6/2002 |
| WO | 7582012013 A1 | 10/2012 |

OTHER PUBLICATIONS

Office Action dated Sep. 29, 2018 for Chinese Patent Application No. 201480067806.0.

\* cited by examiner

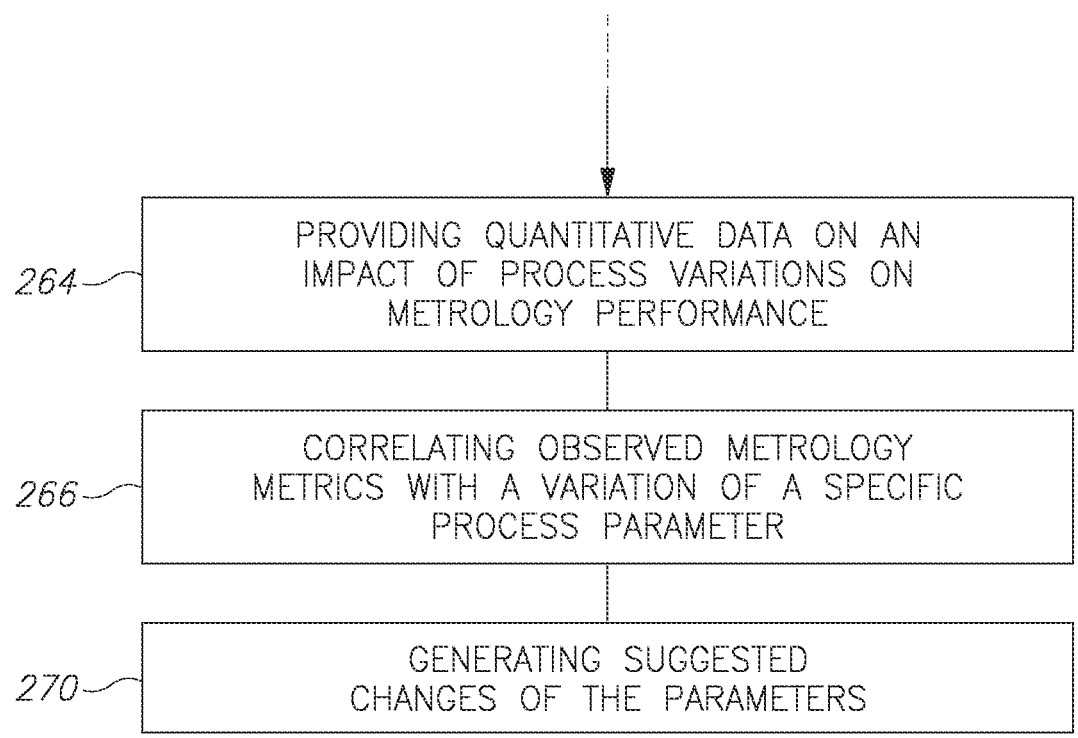
Figure 6 (cont. 1)

TARGET AND PROCESS SENSITIVITY ANALYSIS TO REQUIREMENTS

CROSS-REFERENCE TO RELATED APPLICATIONS

This application is filed under 35 U.S.C. § 111(a) and § 365(c) as a continuation of International Patent Application No. PCT/US14/69617, filed on Dec. 10, 2014, which application claims the benefit of U.S. Provisional Patent Application No. 61/914,950, filed on Dec. 11, 2013, which applications are incorporated herein by reference in their entireties.

TECHNICAL FIELD

The present invention relates to the field of metrology, and more particularly, to sensitivity analysis of metrology measurements to target, process and measurement parameters.

BACKGROUND

Metrology involves large numbers of parameters which are related to targets, target metrology conditions and production processes. Target design, production processes and metrology measurements exhibit varying degrees of sensitivity to these parameters which make it hard to evaluate parameter settings efficiently and make root cause analysis of metrology excursions difficult.

Metrology simulations are generally used to allow metrology engineers to predict the performance of metrology events and to evaluate the dependence of such performance on multiple input parameters. Examples of the input parameters that effect metrology performance include target geometric parameters, metrology system configuration and the film stack and feature topography on the wafer (and their tolerances) resultant from the semiconductor manufacturing process.

SUMMARY OF THE INVENTION

The present invention comprises a system for analyzing targets having an input module arranged to receive a plurality of parameters relating to the targets, target metrology conditions and production processes, to generate target data, a metrology simulation unit for simulation arranged to simulate metrology measurements of the targets from the target data and to generate a plurality of metrics that quantify the simulated metrology measurements, a sensitivity analysis module arranged to derive functional dependencies of the metrics on the parameters and to define required uncertainties of the parameters with respect to the derived functional dependencies, and, a target optimization module for target optimization arranged to rank at least one of the targets and the target metrology conditions with respect to the simulated metrology measurements.

The present invention also comprises a method for analyzing targets, the method having the steps of simulating metrology measurements of the targets with respect to a plurality of parameters related to the targets, target metrology conditions and production processes, generating a plurality of metrics to quantify the simulated metrology measurements, and, deriving functional dependencies of the generated metrics on the parameters to define required uncertainties of the parameters with respect to the derived functional dependencies, wherein at least one of the simulating, the generating and the deriving is carried out by at least one computer processor.

The present invention also comprises a computer-based apparatus to analyze targets, the apparatus having a memory element configured to store a plurality of computer-readable instructions, a processor configured to execute the plurality of computer-readable instructions to simulate metrology measurements of targets with respect to a plurality of parameters related to the targets, target metrology conditions and production processes, generate a plurality of metrics to quantify the simulated metrology measurements, and, derive functional dependencies of the generated metrics on the parameters to define required uncertainties of the parameters with respect to the derived functional dependencies.

Systems and methods are provided for analyzing target geometry, and metrology configuration sensitivities to a wide range of parameters, according to external requirements or inner development and verification needs.

An input module is arranged to receive input parameters relating to targets, target metrology conditions and process parameters and tolerances, to generate target data. In this context, "stack and topography verification" relates to the procedure of verifying that the process parameters used in the simulation are an accurate representation of the actual wafer stack and topography. Examples of the input parameters that effect metrology performance include target geometric parameters, metrology system configuration and the film stack and feature topography on the wafer (and their tolerances) resultant from the semiconductor manufacturing process. In the subsequent description the term "process parameters" relates specifically to said film stack and feature topography and their tolerances.

A metrology simulation unit is arranged to simulate metrology measurements of targets from the input parameters and to generate raw simulated measurement data and multiple derived metrics that quantify metrology performance of the simulated target measurements.

A sensitivity analysis module is arranged to derive functional dependencies of the raw simulated measurement data or derived metrics on the input parameters and to define required tolerances (due to either uncertainties or uncontrolled variations) of the process parameters. The sensitivity analysis module may also enable (i) stack and topography verification to focus on stack and topography parameters of greatest influence, by identifying those for which small process parameter variations result in large variations in one or more metrology metrics (ii) elimination of process variation parameters which conversely show reduced impact on metrology metrics from the subsequent target optimization procedure in order to produce a computationally compact simulation, (iii) quantitative analysis of the impact of process parameter variations on metrology performance to support decisions on manufacturing process modifications in order to subsequently reduce impact on metrology, (iv) root cause analysis of metrology excursion by establishing correlations between metrology metrics and process parameter variations, in the presence or absence of feed forward metrology data from previous process steps and (v) provide an indicator of anticipated quality of simulation to measurement matching.

A target optimization module may be arranged to rank targets and target metrology conditions with respect to the simulated target measurement metrics. As a result, multiple sensitivity responses of the simulated raw measurement data or derived metrics to a wide range of process parameters can be overlaid and compared simultaneously, to provide an effective analysis and design platform.

One aspect of the present invention provides a system comprising an input module arranged to receive a plurality of parameters relating to targets, target metrology conditions and production processes, to generate target data, a metrology simulation unit arranged to simulate metrology measurements of targets from the target data and to generate a plurality of metrics that quantify the simulated target measurements, a sensitivity analysis module arranged to derive functional dependencies of the metrics on the parameters and to define required uncertainties of the parameters with respect to the derived functional dependencies, and a target optimization module arranged to rank at least one of the targets and the target metrology conditions with respect to the simulated target measurements.

These and other objects, advantages and features of the present invention will be better appreciated by those having ordinary skill in the art in view of the following detailed description of the invention in view of the drawings.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
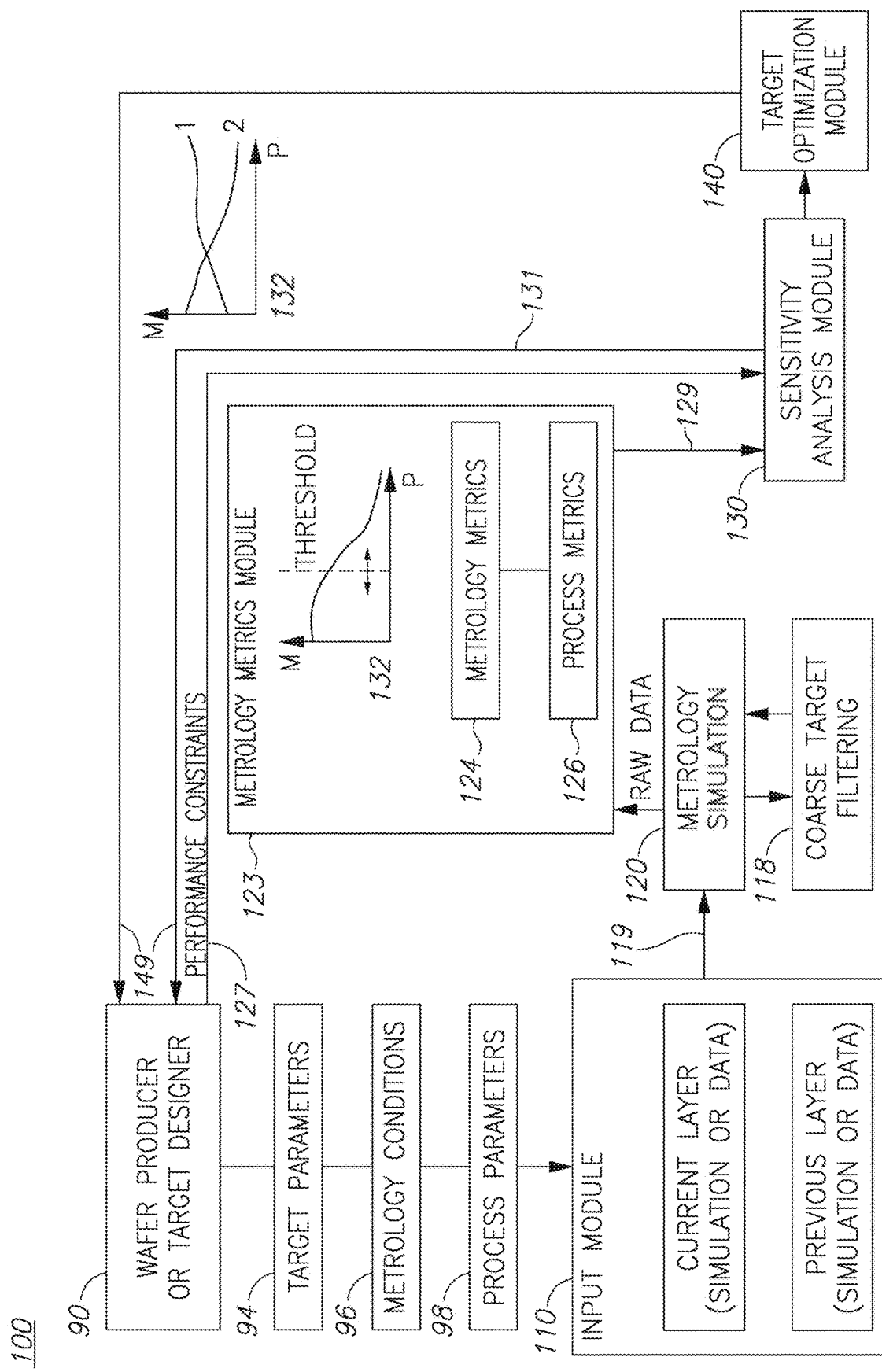
FIG. 1 is a high level schematic overview block diagram of a system and information generation and flow in the system, according to some embodiments of the invention.

At the outset, it should be appreciated that like drawing numbers on different drawing views identify identical, or functionally similar, structural elements of the invention. While the present invention is described with respect to what is presently considered to be the preferred aspects, it is to be understood that the invention as claimed is not limited to the disclosed aspect. Also, it is to be understood that the invention is not limited in its application to the details of construction and the arrangement of the components set forth in the following description or illustrated in the drawings. The invention is applicable to other embodiments or of being practiced or carried out in various ways and is intended to include various modifications and equivalent arrangements within the spirit and scope of the appended claims.

Furthermore, it is understood that this invention is not limited to the particular methodology, materials and modifications described and as such may, of course, vary. It is also understood that the terminology used herein is for the purpose of describing particular aspects only, and is not intended to limit the scope of the present invention, which is limited only by the appended claims.

In the below description, an embodiment is an example or implementation of the invention. The various appearances of "one embodiment", "an embodiment", "certain embodiments", "example embodiments", or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone.

Unless defined otherwise, all technical and scientific terms used herein have the same meaning as commonly understood to one of ordinary skill in the art to which this invention belongs. Although any methods, devices or materials similar or equivalent to those described herein can be used in the practice or testing of the invention, the preferred methods, devices, and materials are now described.

The term "metric" as used herein in this application, is defined as any quantity related to given measurements, such as the raw measurements themselves (an identity metric)), derived quantities relating to one or more measurement types, quantities relating to combinations or interactions of measurements, as well as "meta metrics" which are derived from one or more other metrics and possibly one or more measurement types.

Figure 2:
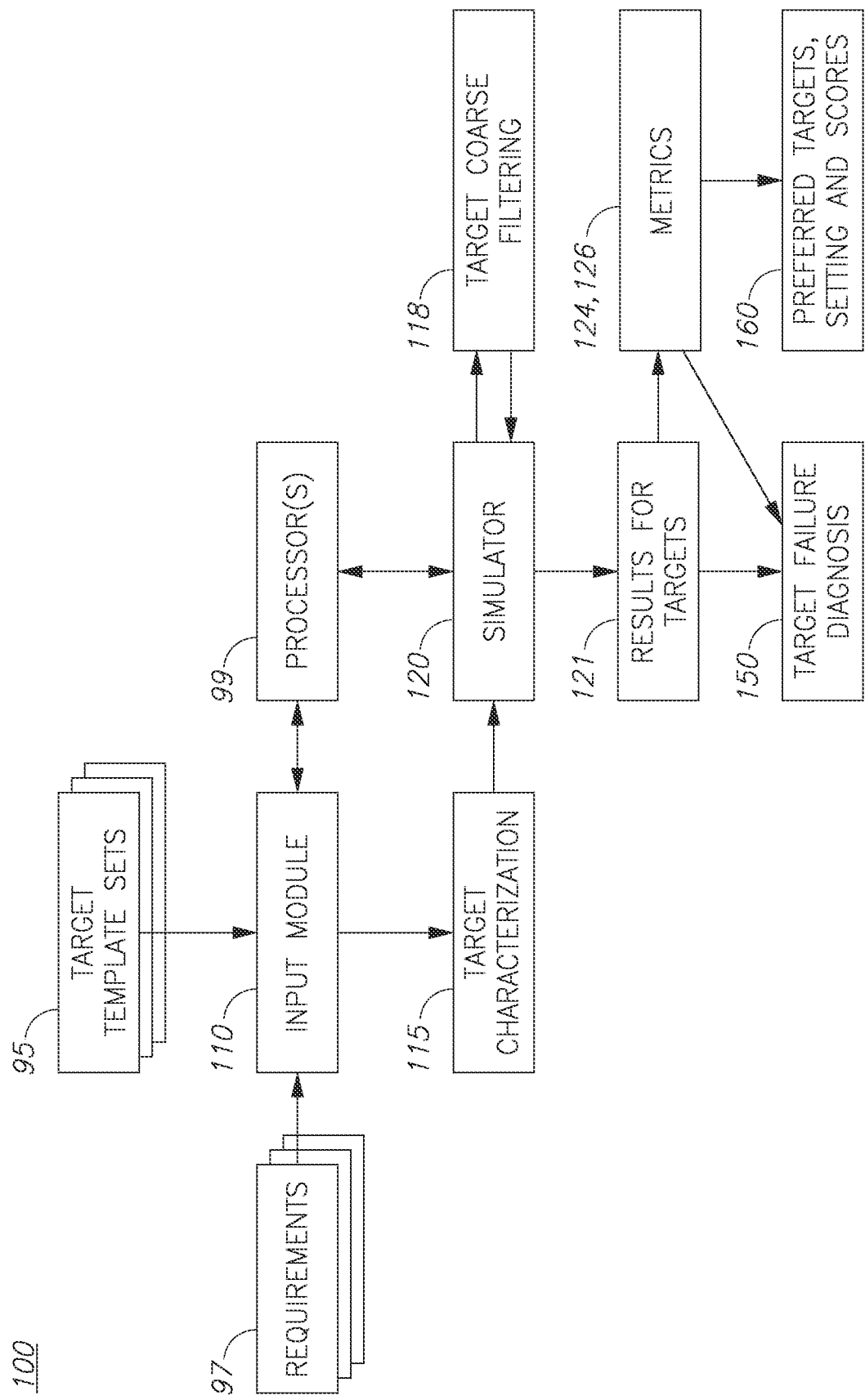
FIG. 2 is a high level schematic overview block diagrams of a system and information generation and flow in the system, according to some embodiments of the invention.

FIGS. 1 and 2 are high level schematic overview block diagrams of system 100 and information generation and flow in system 100, according to example embodiments of the invention. System 100 may comprise input module 110, metrology simulation unit 120, sensitivity analysis module 130 and target optimization module 140. System 100 is configured to analyze target parameters, metrology sensor configurations parameters, process parameters, parameter sensitivities according to given requirements, production conditions, and metrology specifications.

Input module 110 is arranged to receive, e.g., from wafer producer 90 or from target designer 90, a plurality of parameters relating to targets (target parameters 94), metrology conditions 96 and optionally to production process (process parameters 98), and generate target design data and metrology sensor configuration recommendations 119 therefrom. Non-limiting examples for target parameters 94, metrology parameters 96, and process parameters 98 are provided in the following.

Target parameters 94 may comprise, with respect to any of the target layers and as non-limiting examples, target geometrical parameters such as grating pitch, offsets between layers, critical dimensions (CD), segmentations, orthogonal or parallel, chemical mechanical polish assist features, sub resolution (or resolved) assist features and dummification features in same or different layers to the metrology target features themselves.

Metrology conditions 96 may comprise, as non-limiting examples, illumination parameters, e.g., wavelength, bandwidth, angle of polarization, spatial and/or temporal coherence, angle of incidence, numerical aperture, illumination pupil configuration, peak or average power, fluence and other parameters such as geometrical optical configuration and optical information, type of metrology (e.g., scatterometry or imaging) etc.

Process parameters 98 may comprise target resist profiles, stack and resist properties (e.g., materials, critical dimensions such as bar width, side wall angles, side wall angle asymmetries, topography, deposition, etching or polishing related topography, and asymmetries thereof, and further processing properties, process window parameters, types and distributions of lithographic illumination and imaging aberrations.

Input module 110 may be further arranged to receive and provide process simulation results and/or process data relating to the target layers, e.g. to a previous layer and a current layer. Any combination of simulation and process data relating to the targets and to the production processes may be provided by input module 110 to metrology simulation unit 120. The data may comprise physical and optical parameters of targets or any other structure on the wafer as well as simulated process and target parameters and their variability over the wafer.

Metrology simulation unit 120 is arranged to simulate metrology measurements of targets from target data 119 and to generate a plurality of metrology metrics 124 and possibly process metrics 126 that quantify the simulated target raw measurements or derived metrology metrics. In example embodiments, metrology simulation unit 120 is arranged to generate data related to the simulated target structures and metrology results of the simulated targets, by applying an optical simulation to the data provided by input module 110. In example embodiments, metrology metrics module 123 may be part of metrology simulation unit 120 or associated therewith, and arranged to calculate metrics 124, 126 from raw simulation data generated by metrology simulation unit 120. Metrology metrics module 123 (or metrology simulation unit 120) may provide process parameter tolerances 129 to sensitivity analysis module, as explained below with reference to FIG. 8. The optical simulation relates to various metrology parameters and measurement process.

Metrology simulation unit 120 may be arranged to calculate a plurality of metrology metrics 124. In example embodiments, wafer producer 90 may define the identity of at least some metrics 124 or process metrics 126, as well as performance constraints 127 and tolerance ranges and thresholds relating to metrics 124, 126.

Non-limiting examples for metrics comprise various symmetry quality merits, reaming to different features of the targets (e.g., different elements, different layers), geometrical merits such as slopes and forms of elements and of layers, dimensional merits (e.g., structure critical dimensions CDs), correlational merits that quantify structural relations between elements and layers, and process efficiency merits relating e.g., to deposition or etching steps.

Different metrics may be compared or combined to define further metrics, and metrics may be compared to or combined with various data to yield further metrics, e.g., a comparison of a process window metric with the device process metric (e.g., a visual comparison over a user interface) may be used as an additional metric.

Further metrology performance metrics 124 may comprise target diffraction efficiency, metrology accuracy (defined as the difference between the nominal geometric metrology result and the simulated metrology result) or metrology accuracy flags such as quality merits derived from Fourier analysis or decomposition of metrology signals, or derived pupil distribution functions. Additional metrology performance metrics 124 may comprise precision, contrast or sensitivity of raw or derived metrology signal to overlay variation.

In example embodiments, system 100 may comprise requirements 97 such as various target template sets 95. Input module 110 may be configured to receive these inputs and generate respective workbooks from which target characterization files 115, describing e.g., respective ±first order (or higher order) reflectivities of the inputted target. These data may be used in a subsequent computation step, e.g., by an overlay calculation module in simulator 120, to simulate the overlays of the inputted target and their dependencies on the inputted process parameters and their tolerances. Sensitivity analysis module 130 and target optimization module 140 may derive and process metrology metrics 124, process metrics 126 and yield a prioritized list 160 of targets, tool setups and respective scores that allow optimizing target designs, the production processes and the metrology measurements.

In example embodiments, sensitivity analysis module 130 may be configured to enable stack and topography verification prior to target optimization to focus on process parameters with the greatest influence on target metrics. In example embodiments, sensitivity analysis module 130 may be configured to eliminate insensitive process variation parameters, prior to target optimization and hence provide a more computationally compact simulation process.

In example embodiments, sensitivity analysis module 130 may be configured to provide quantitative data on the impact of process variations on metrology performance to support decisions on manufacturing process modifications in order to reduce impact on metrology. In example embodiments, sensitivity analysis module 130 may be configured to be used in conjunction with feed forward of metrology data, for example, but not limited to film, critical dimension, stress, shape or n & k data from layers from previous processing steps in order to anticipate a metrology excursion during a subsequent metrology step. Furthermore, given the availability of such fed-forward data (or in its absence), sensitivity analysis module 130 may be configured to enable root cause analysis of the subsequent metrology excursion by correlating the observed metrology metric with a variation of a specific process parameter. In example embodiments, sensitivity analysis module 130 may be configured to provide an indicator of anticipated quality of simulation to measurement matching.

In example embodiments, the target contenders may be inputted in any format (e.g., GDSII (Graphic Database System II) format) and be used to derive target profiles which are used together with process related data such as scanner aberrations and pattern placement errors (PPEs), illumination process window parameters (e.g., depth of focus DOF and energy latitude EL) and other, e.g., thickness related process window parameters—to compare the targets under various process conditions. Such comparison may be applied as an initial fidelity simulation. In example embodiments, methodology elements related to creating a metrology target structure design for a reticle layout may be incorporated from U.S. Pat. No. 7,925,486, which is incorporated herein by reference in its entirety.

In example embodiments, simulator 120 may use any of the following parameters to simulate the targets: apodization of metrology illumination beam(s), pupil calibration, illumination types and patterns, masking types and parameters, polarization, spectral characteristics etc. Simulator 120 may be configured to calculate overlays, precision metrics, diffraction efficiency etc.

Figure 3:
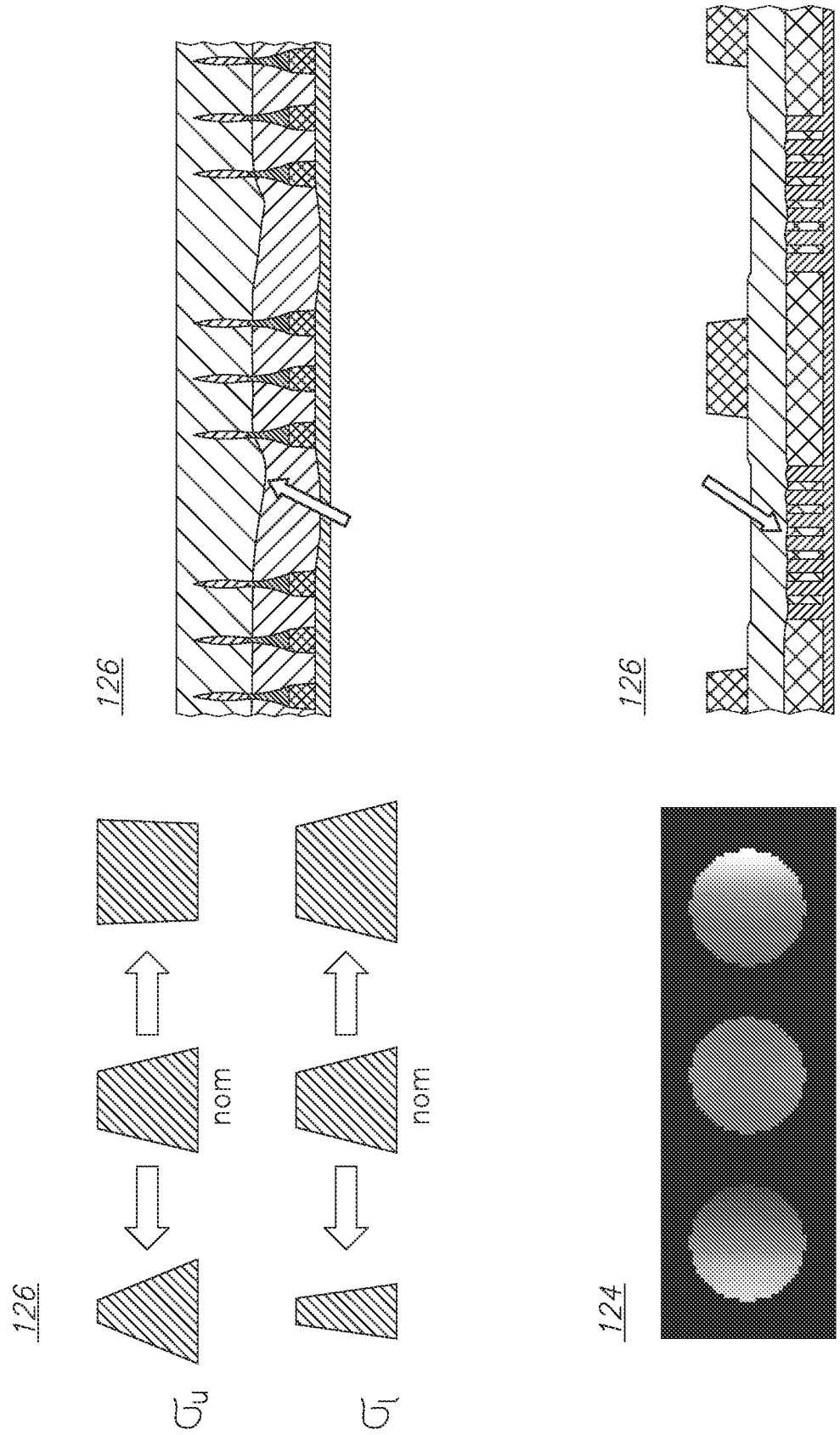
FIG. 3 is an illustration for metrics that relate to target and measurement features, according to some embodiments of the invention.

FIG. 3 presents non-limiting illustrations for metrics that relate to target and measurement features, according to some embodiments of the invention. Top left example 124 illustrates an example for a process robustness metric which may be used to estimates precision susceptibility to realistic process variations. Customer or target designer 90 may set process variation parameters and process variation range, and define the quality of interest, e.g., a level of precision degradation such as $g([\sigma_l, \sigma_u]) = \max\{\sigma_l, \sigma_u\}/\sigma_{nom}$, with g being the metric, $\sigma_l$, $\sigma_u$ being the standard deviations for a lower and an upper target element, respectively, and $\sigma_{nom}$ being the standard deviation for the nominal target, as indicated in FIG. 3.

Bottom left example 124 illustrates an example for a diffraction efficiency (DE) metric 124 for zeroth order and first order pupil plane images. DE metric 124 may be calculated as sums or averages over all rays propagating in each of the 0, ±1 order images. DE metric 124 may be used to indicate accuracy risk, as low diffraction efficiency elevates the accuracy risk, especially for small targets. DE metric 124 may be derived with respect to a multitude of various parameters 94, 96, 98, such as type and form of the illumination, optics, and masks, as well as target design and process parameters. Performance constraints 127 may be set upon metrics 124 that are set to quantify these effects, e.g., by wafer producers or target designers 90.

The right-hand illustrations in FIG. 3 illustrate irregularities resulting from process features in the production of structures such as FinFET structures. Top right example illustrates effects of dishing, resulting in an irregular boundary between layers (see arrow), while bottom right example illustrates irregularities in the FinFET structures themselves and their borders to a top layer (see arrow). These effects may be quantified as metrology metrics 124 and process metrics 126; and performance constraints 127 may be set thereupon.

An example for precision metric 124 comprises an estimation of Adaptive Noise Reduction Algorithm (ANRA) precision by generating noisy images using a noise model, defining a quality of interest to be e.g., 3σ of the overlays and calculating a metric which exhibits a high sensitivity around the specifications (spec), e.g., $f(\sigma)=0.5+\arctan(10\cdot(3\sigma-\text{spec})/(a\cdot\text{spec}))/\pi$ as a non-limiting example, with a as a tuning parameters, to yield the high sensitivity (a steep slope around 0.5 in representation 132). Similar metrics may be calculated for various parameters.

An example for accuracy metric 124 comprises an estimation of the overlay error due to accuracy-breaking target variations such as target element dimensions and geometric parameters. Customer or target designer 90 may set accuracy parameters and reasonable variation ranges for the accuracy parameters, as well as accuracy thresholds (allowed overlay inaccuracy) and define the quality of interest, e.g., a span of overlay values under the given variation with respect to the overlay measured or simulated for nominal (accurate) targets.

Sensitivity analysis module 130 is arranged to receive data and/or metrology metrics 124 and process metrics 126 from metrology simulation unit 120. Sensitivity analysis module 130 is further arranged to derive functional dependencies 131 of metrology and process metrics 124, 126 on parameters 94, 96, 98 and to define required uncertainties 149 of the parameters with respect to the derived functional dependencies 131. In example embodiments, sensitivity analysis module 130 may be arranged to derive some or all of metrology and process metrics 124, 126, and/or calculate additional metrics therefrom.

Metrology metrics 124 may further comprise, as non-limiting examples, process robustness, precision sensitivity, Diffraction efficiency, accuracy, precision, lithography performance, and algorithmic inaccuracy. In example embodiments, metrology metrics 124 may comprise a tool set up robustness metric, with tool set-up comprising e.g. a setting of polarization, wavelength and apodizer. Sets of certain geometries and certain tool set ups, which share the same geometry but are paired with different tool set up configurations, may be compared using system 100 and the respective methods. The suggested metric may enhance the ranking for targets which may be measured at different set-ups. Process metrics may comprise, as non-limiting examples, printability, placement errors, and symmetry. Metrology and process metrics 124, 126 may be expressed in absolute measures (e.g., in nanometers, angle degrees) and/or in relative measures (e.g., on a zero to one scale).

Metrics 124, 126 may be compared or represented on a common scale which is set according to specification requirements. Specific parameters 94, 96, 98 and sensitivities to the parameters may then be analyzed in view of all metrics together, and different considerations may be balanced while overview is maintained.

Sensitivity analysis module 130 may be further arranged to generate data and/or representations 132 relating to the dependency of metrology and process metrics 124, 126 on parameters 94, 96, 98. Sensitivity analysis module 130 may be arranged to derive functional dependencies of metrology and process metrics 124, 126 on parameters 94, 96, 98 and to represent received requirements (e.g., from wafer producer 90) with respect to the derived functional dependencies, illustrated in a non-limiting manner in representations 132.

Figure 4:
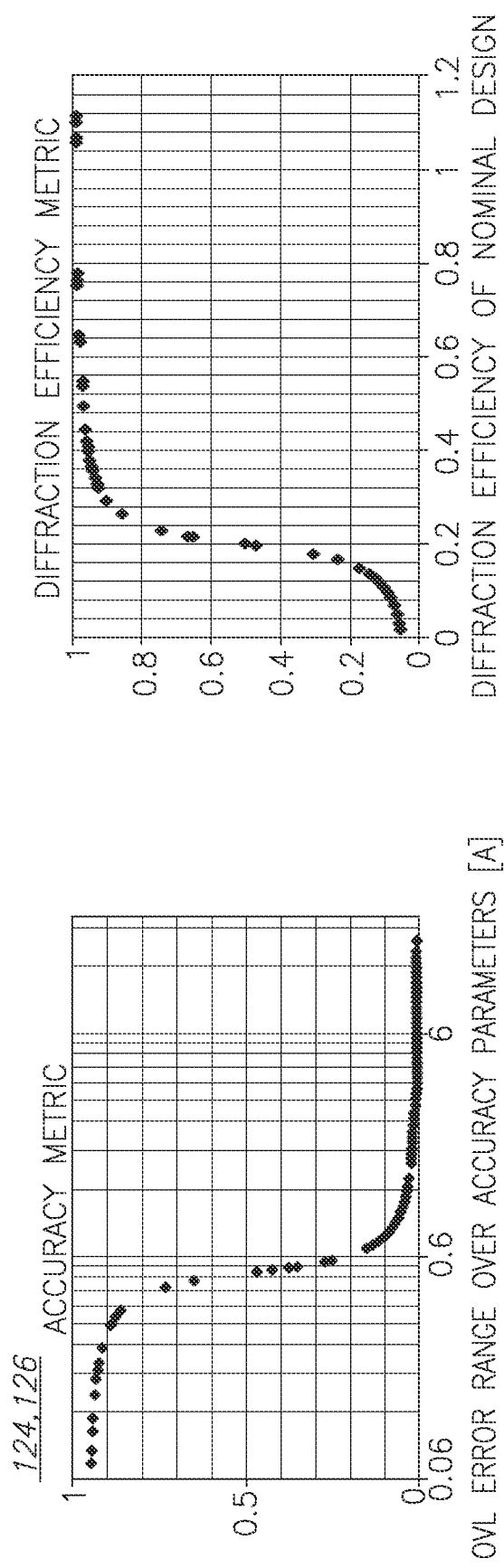
FIG. 4 is a graphical representation for metrics and their representations that relate to target and measurement features, according to some embodiments of the invention.

FIG. 4 presents non-limiting illustrations for metrology and process metrics 124, 126 and their representations 132 that relate to target and measurement features, according to some embodiments of the invention. The metrics parameters functional dependencies may be used for determining best targets or settings. FIG. 4 schematically illustrates four examples, for an accuracy metric depending on the overlay error range over accuracy parameters (in Angstroms), for a precision metric depending on the overlay 3σ (in Angstroms), for a diffraction efficiency metric depending on the diffraction efficiency of a nominal design (relative units) and for a process robustness metric depending on the ratio between the worst 3σ and the nominal 3σ over process variation.

Representations 132 may comprise graphs that illustrate the sensitivity of any of metrology and process metrics 124, 126 on parameters 94, 96. For example, the illustrated graph is a declining function of metric NI as function of parameter P, wherein an exemplary threshold (provided by wafer producer 90) is marked by the dashed line. The dashed arrow indicates either a tolerance specified by wafer producer 90 and/or an expression of the sensitivity of the value of metric NI on parameter P, as calculated or estimated by sensitivity analysis module 130. For example, a sensitivity to oxide layer thickness may be quantified by the diffraction efficiency metric as a function of the layer thickness, measured over different illumination conditions. The resulting metrics may be compared and an oxide layer thickness that provides specified metric values over the range of illumination conditions may be selected. In example embodiments, illumination conditions may be selected according to the comparison of the metrics, to provide a required sensitivity level. In another example, sensitivity to poly layer thickness may be quantified by the diffraction efficiency metric as a function of the layer thickness, measured over different illumination conditions. The resulting metrics may be compared and a poly layer thickness that provides specified metric values over the range of illumination conditions may be selected. In example embodiments, illumination conditions may be selected according to the comparison of the metrics, to provide a required sensitivity level. Any process parameter may be selected based upon the comparison of the metrics (e.g., using representations 132).

Sensitivity analysis module 130 may be arranged to derive or estimate the functional dependencies of various metrology metrics 124 and process metrics 126 on parameters 94, 96, 98 (in any combination of either) to derive or estimate the sensitivities of metrics 124, 126 to changes in parameters 94, 96, 98 as a measurement for uncertainty levels involved in the metrology and/or production processes. These derivations or estimations may be used to adjust any of the target parameter ranges and the process parameter ranges and/or any of the metrics and the related thresholds and tolerances, and thus provide wafer producer 90 a potent tool for understanding the interrelations between target and process parameters and metrology and production outcomes. Improvements of required values and weights for the metrics may be suggested according to the sensitivity analysis. The suggested improvements may be seen as definitions of the required uncertainties 149 of the parameters or as suggested amendments for metrology or process specifications (set e.g., by wafer producer 90).

For example, sensitivity analysis may be used to show that overlay error is very sensitive to some accuracy parameter (for example, to side-wall angle SWA asymmetry). For example, for a given asymmetry range (e.g., max $|SWA_{left}-SWA_{right}|=2°$) and a given accuracy threshold (e.g., 0.5 nm), an accuracy metric may be used to indicate the ability to differentiate respective targets (e.g., metric≈0 may indicate absence of the ability to differentiate respective targets). System 100 may be used to improve targets or metric to enable target differentiation, e.g., by providing a tighter asymmetry range (for example, max $|SWA_{left}-SWA_{right}|=0.5°$, in case the value is realistic); by providing and increased accuracy threshold (for example, 2 nm in case the value is realistic); by assigning a high weight to the accuracy metric; or ignoring the information to remove the accuracy from being an important parameter in target optimization.

In example embodiments, system 100 is arranged to allow wafer producers, target designers and/or metrology providers 90 to effectively define metrology targets and metrics, under consideration of their interrelations through the process and measurements, as determined empirically or by simulation. Using system 100, production and metrology requirements may be handled rationally, under consideration of the revealed tradeoffs among parameters and requirements provided by sensitivity analysis module 130.

Moreover, system 100 may be configured to define or generate required uncertainties of the parameters with respect to the derived functional dependencies, which provide an understanding of the metrology and/or production process and makes parameter selection more controllable and comprehensive.

In example embodiments, input module 110 and/or simulator 120 may be configured to apply an initial sorting of the targets to reduce the number of simulated targets and/or of intensely simulated targets (in contrast to cursorily simulated targets). System 100 may use brief or coarse, characterization of targets to rule out a large number of targets and leave only a smaller number of targets for a detailed analysis (e.g., simulation) and comparison. A coarse sorting out of irrelevant target designs may be used to accelerate the evaluation process and focus the process on a smaller set of relevant targets. In example embodiments, the sensitivity analysis may be performed on the basis of a single nominal target design geometry. Clearly, the coarse characterization depends on the defined parameters and may focus each run on the respectively relevant targets. The coarse characterization may be carried out using a cursorily simulation, e.g., tracing just a few rays instead of a full simulation or using just one or few basic signal harmonies instead of a large number of harmonies (i.e. truncating the dispersion calculation) to achieve efficient initial classification. Coarse characterization may be used to enhance the computational efficiency of system 100.

Figure 5:
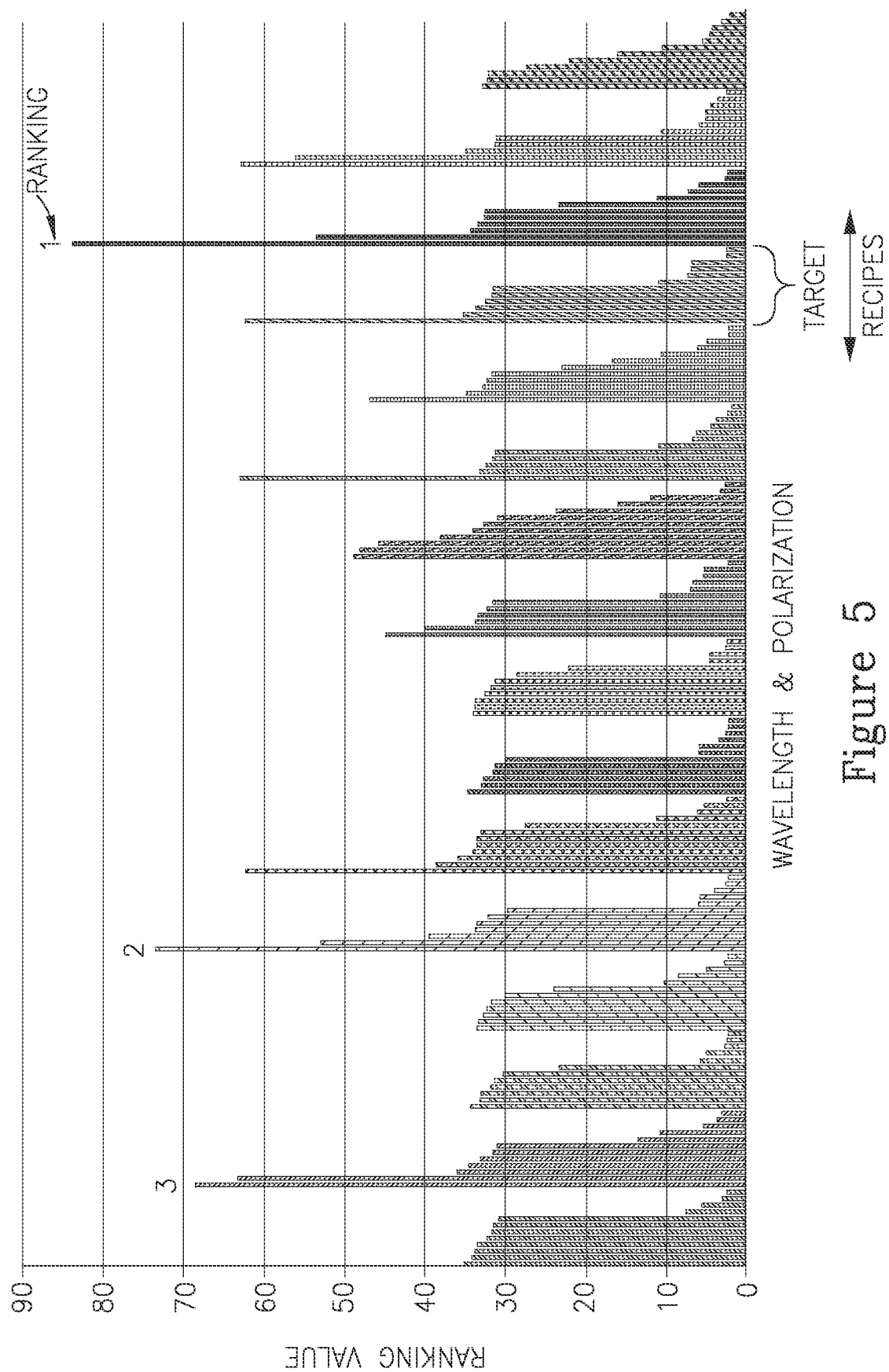
FIG. 5 is a graphical representation that schematically illustrates ranking examples, according to some embodiments of the invention.

FIG. 5 schematically illustrates ranking examples, according to some embodiments of the invention. System 100 may comprise a target optimization module 140 arranged to receive data from sensitivity analysis module 130 and derive a ranking of targets, metrology conditions and/or other wafer production aspects (e.g., grating efficiency, inaccuracy, process robustness, precision, PPE differential, printability, SCOL friendliness) with respect to any of metrology and process metrics 124, 126, as well as with respect to the functional dependencies of metrology and process metrics 124, 126 on parameters 94, 96 obtained from sensitivity analysis module 130. Target optimization module 140 may be configured to define or generate required uncertainties (149) of the parameters with respect to the derived ranking. FIG. 5 illustrates sixteen targets, each represented by a group of adjacent and similarly-hatched columns. Each column schematically represents a different measurement and/or production recipe which determines the measurement parameters and the production parameters which are used in the simulation (in the non-limiting illustrated example, these are the wavelength and polarization of the measurement illumination). Target optimization module 140 may evaluate and rank each target at each recipe separately (ranking values on the y axis) and then evaluate targets or recipes according to the accumulated ranks (see 1, 2, and 3 at the top of FIG. 5). Clearly, ranking may be carried out at multiple levels and depend on a wide range of parameters.

For example, the ranking may account for the metrics' sensitivities to various parameters (e.g., targets, process and/or measurement parameters). Target optimization module 140 may be configured to weigh the sensitivities under defined ranges of parameters and analyze which metrics and/or which targets are ranked higher in view of the sensitivities. Ranking analysis may be carried out for any metric 124, 126 and their combinations, and with respect to any parameters 94, 96, 98 and their combinations, thus providing a complex analysis of the production and metrology processes with respect to the settings, definitions and requirement provided by wafer producer 90.

System 100 may apply the described analysis repeatedly to approach received requirements and/or to improve a matching between the requirements from the metrics and the provided parameters.

In example embodiments, system 100 may further comprise a target design module, arranged to design specific targets according to specified design rules and with respect to the ranking produced by target optimization module 140, which may be a result of multiple iterations of the data processing process described above. In example embodiments, system 100 may further comprise a design rules checker, arranged to verify target compliance with specified design rules and/or suggest modifications to target design to comply with specified design rules. Design rule verification and adaptation may be applied to the target or process parameters and/or to the data from input module 110. Furthermore, the sensitivity analysis may take into account required target adaptation to achieve design rules compliance and estimate, calculate or represent the sensitivity of respective metric to such adaptation. For example, additional parameters for finalizing the target design may comprise cell composition and arrangement, additional customer specifications and corrections related to design rule checking. The finalizing of these parameters may also be influenced by the functional dependencies, required uncertainties, the ranking and the reiteration of the above described flows.

Figure 6:
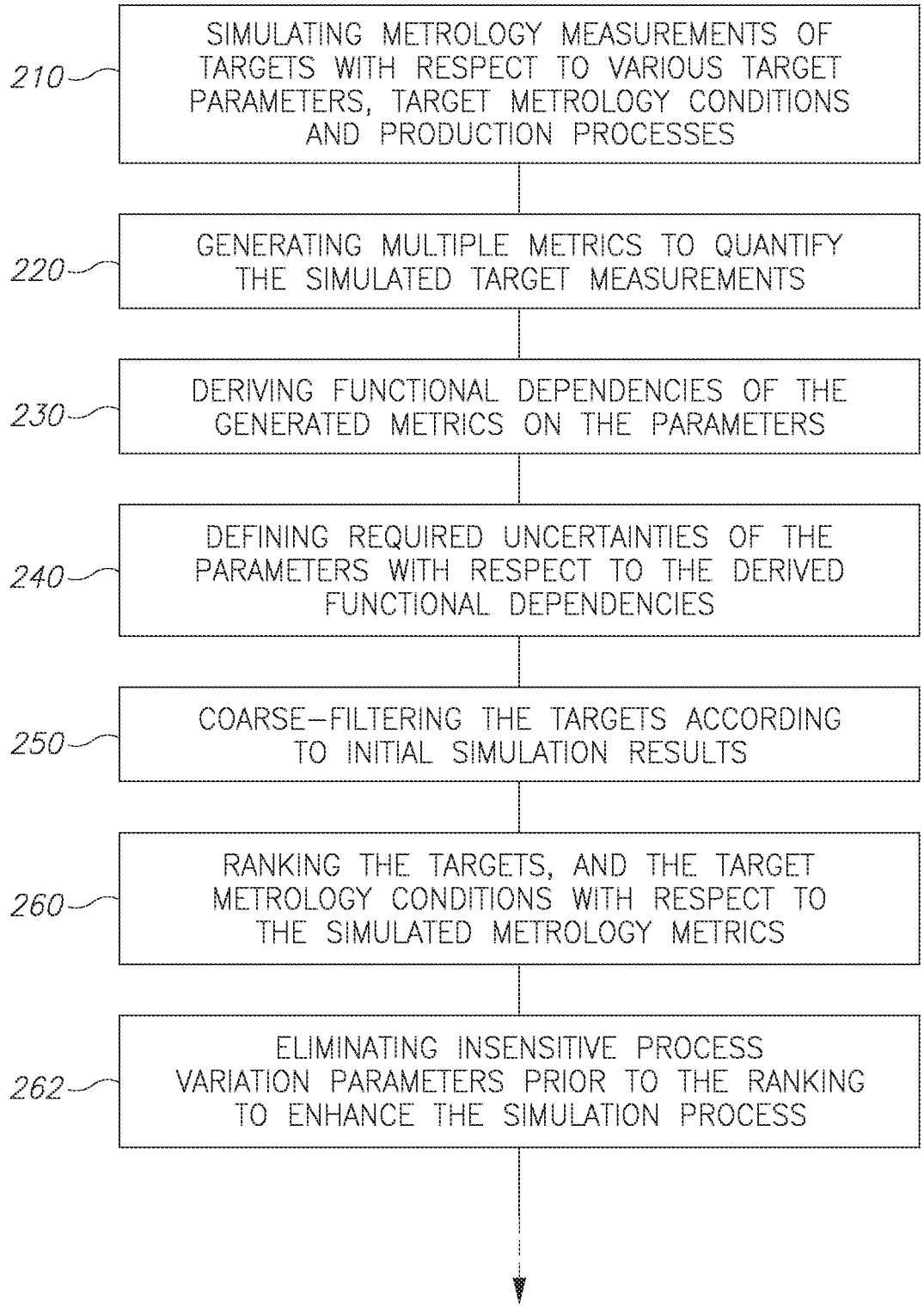
FIG. 6 is a high level schematic flowchart illustrating a method, according to some embodiments of the invention.

FIG. 6 is a high level schematic flowchart illustrating method 200, according to some embodiments of the invention. Any of the data processing stages, calculations and control stages of method 200 may be partly or fully implemented by respective processors and algorithms may be implemented by respective computer program product(s) comprising a computer usable medium having computer usable program code tangibly embodied thereon, the computer usable program code configured to early out at least part of the respective stages.

Method 200 may comprise any of the following stages: simulating metrology measurements of targets with respect to a plurality of parameters related to targets, target metrology conditions and production processes (stage 210), generating a plurality of metrics to quantify the simulated target measurements (stage 220), and deriving functional dependencies of the generated metrics on the parameters to define or generate required uncertainties of the parameters with respect to the derived functional dependencies (stage 230). At least a part of any of simulating 210, generating 220 and deriving 230 may be carried out by at least one computer processor.

In example embodiments, method 200 may further comprise defining required uncertainties of the parameters with respect to the derived functional dependencies (stage 240). Method 200 may further comprise coarse-filtering the targets according to initial simulation results (stage 250).

Method 200 may further comprise ranking at least one of the targets and the target metrology conditions with respect to the simulated target measurements (stage 260). The method may further comprise generating suggested changes to at least one of the parameters (stage 270).

In example embodiments, method 200 may further comprise at least one of eliminating insensitive process variation parameters prior to the ranking to enhance the simulation process (stage 262); providing quantitative data on an impact of process variations on metrology performance (stage 264); and correlating observed metrology metrics with a variation of a specific process parameter (stage 266).

In example embodiments, system 100 may be configured to compare process parameters and/or metrology conditions settings with given fixed targets. In such cases, metrology simulation unit 120 may simulate the respective processes and conditions with respect to known targets, and sensitivity analysis module 130 may derive a subset of metrics which is relevant to the process parameters and/or metrology conditions settings (e.g. precision and accuracy) and analyze their sensitivity to the received parameters. Target optimization module 140 may be configured to rank the respective processes or settings with respect to the analyzed sensitivities.

Figure 7:
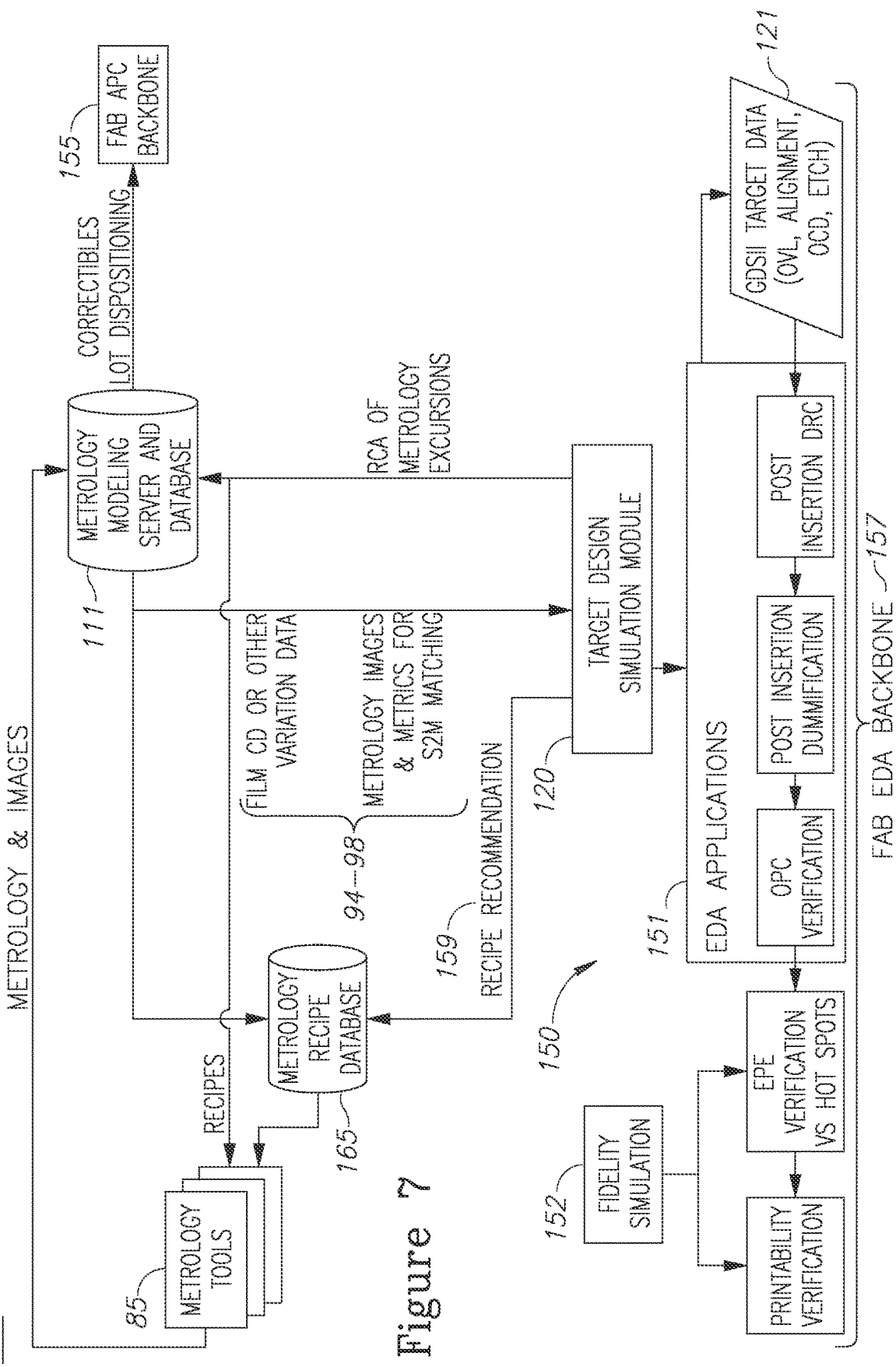
FIG. 7 is a high level schematic block diagram of the system, according to some embodiments of the invention; and, FIG. 8 is a diagram exemplifying different sensitivities of a metrology metric to different process variation parameters; according to some embodiments of the invention.

FIG. 7 is a high level schematic block diagram of system 100, according to some embodiments of the invention. In FIG. 7 several additional non-limiting methods of implementation are described in the broader framework of data flow in the manufacturing and design flow in the fab.

Metrology and images from metrology tools 85 are delivered to a metrology modeling server and database 111, which may be incorporated in input module 110. Metrology modeling server and database 111 updates a metrology recipes database 165 which provides metrology recipes to metrology tools 85. In system 100, Metrology modeling server and database 111 may further provide parameters 94-98 to target design simulation module 120, which may then provide recipe recommendations 159 to metrology recipes database 165, RCA (Root-Cause Analysis) of metrology excursions back to metrology modeling server and database 111, and data to EDA (Electronic Design Automation) applications 151 as part of fab EDA backbone 157, operating on GDSII target data 121, and being e.g., part of the target failure diagnosis 150, used for fidelity simulations or for any other part of the design process.

One of the outputs from the target design process are one or more recommendations 159 of an optimal measurement recipe, i.e., conditions of measurement. This information is sent to a metrology tool recipe database 165, or alternately directly to one or more metrology tools 85. Metrology data such as overlay metrology results may be sent from individual metrology tools 85 to metrology modeling application 111. This modeling application (which may also include a results database) analyzes the results including the temporal or spatial signature at both wafer and lithographic field level and sends correctibles or lot dispositioning decisions to the fab APC (automated, process control) system 155 of the fab. Such information may alternately be sent directly to a processing or patterning tool such as a lithography tool, etch tool or deposition tool (not shown).

In example embodiments, metrology modeling server 111, which may receive metrology data from multiple metrology tools in the fab such as film metrology data, wafer shape and stress data, CD metrology data etc., collected subsequent to a previous processing step may forward such data to a target designer (e.g., using target design simulation module 120). The target designer, and more specifically sensitivity analysis module 130, may use this (real, not hypothetical) data to predict, for a specific target design which actually exists on the wafer, the impact on specific metrology metrics. In this way, the metrology engineer may receive an early warning of an anticipated metrology excursion for a given wafer or lot. In response to this early warning, the recipe database manager (not shown) or metrology modeling server 111 may choose to modify the metrology sampling in accordance with anticipated excursion, to minimize impact on metrology accuracy or metrology robustness.

In example embodiments, even in the absence of fed forward metrology data from previous metrology steps, sensitivity analysis module 130 may be used to establish a causal relationship between specific process variations and actual observed metrology metrics excursions. For example, a lot arriving to metrology tool 85 and a target previously simulated by target designer may be measured by metrology tool 85. Specific metrology metrics for example, diffraction efficiency results may then be observed to have significantly changed e.g., increase, while scatterometry overlay sensitivity strongly decreases. These results are transferred to target designer via modeling server or directly, and target designer isolates a small subset of process variations (or a single process variation) e.g., a-Si (amorphous silicon) film thickness, which is likely to produce the specific metrology excursion described above. The excursion may also be a large cross-wafer variation, i.e., it could be that the excursion may have either a spatial or temporal signature.

In example embodiments, subsequent to target designer recommending a specific target design and that design being printed on a wafer, said wafer may be measured by metrology tool 85. In order to verify target designer performance and/or to improve subsequent design iteration of the same or similar layer, the metrology results, either raw measurement data or metrology metrics 124 as measured by metrology tool 85 may be transferred back to the target designer for simulation to measurement matching (S2M). Such matching analysis may also be performed by metrology modeling server (e.g., in target design simulation module 120).

The methodology described above may be applied to multiple types of metrology targets including but not limited to overlay, CD, lithographic focus, does and alignment targets, etch metrology targets etc.

In example embodiments, system 100 may be used to compare metrology systems and metrology configurations by comparing their optical simulations with respect to the derived functional dependencies and uncertainty relations between the metric and the parameters. In example embodiments, future metrology tools may be compared with current tools, and suggestions concerning tool choice (e.g., with respect to given settings, targets, parameters and metrics) may be generated. System 100 may thus assist in metrology tool optimization during development, by comparing various metrology tool designs according to the procedures disclosed above.

Figure 8:
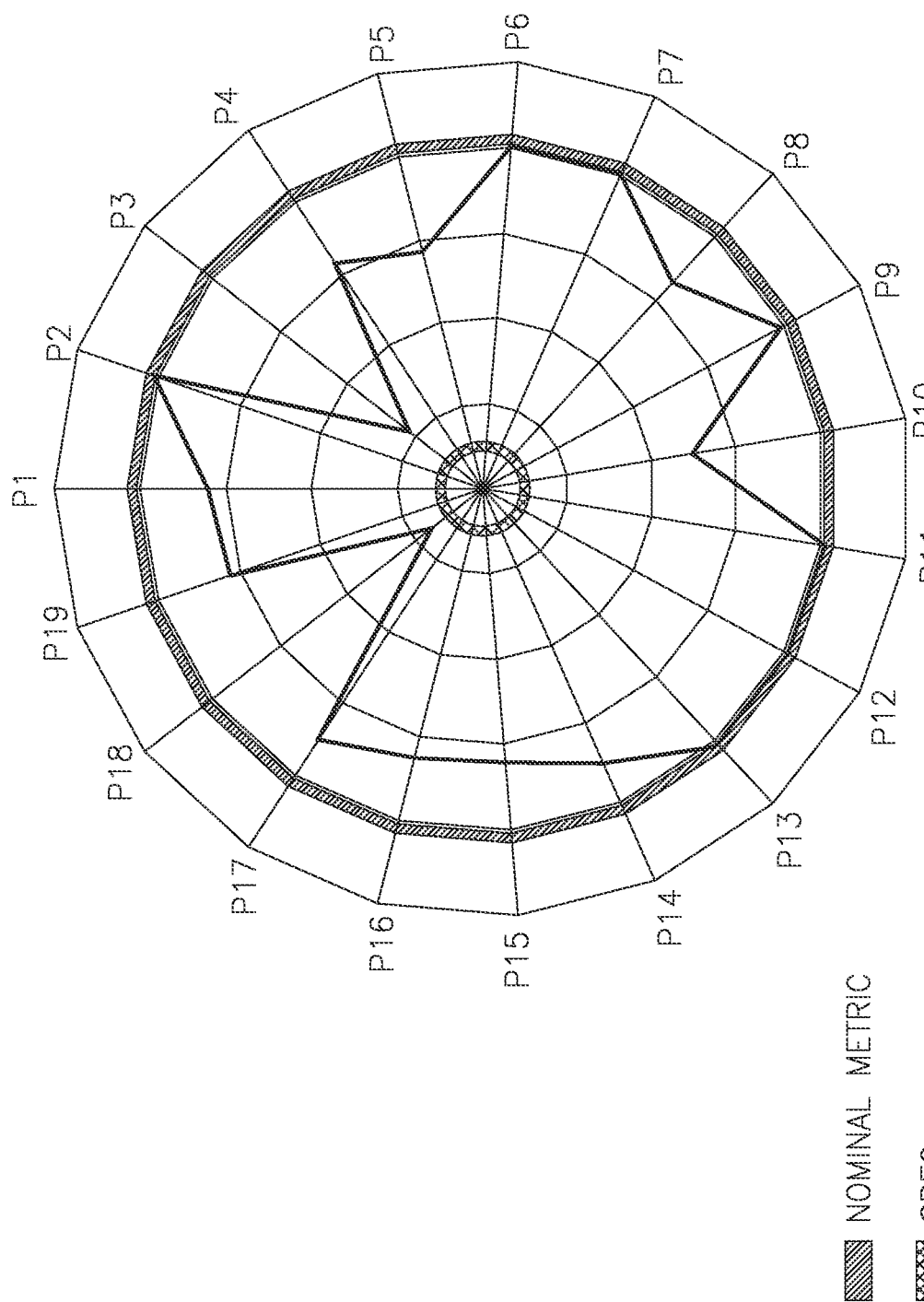

FIG. 8 is a diagram exemplifying different sensitivities of an exemplary metrology metric to different process variation parameters, according to some embodiments of the invention. The diagram compares sensitivity of metrology metric 124 to different process variation parameters 98 denoted by P1, P2, . . . , P19, comprising parameters such as dimensions of target features, deviation from designed dimensions, symmetry characteristics and so forth. P1, P2, . . . , P19 may include target parameters 94 as well, which are inadvertently influenced by process variation parameters 98. The diagram presents a larger circle defining a nominal value of a metric and a small circle defining a maximal allowed deviation of the parameters from their nominal values which is allowed by the specifications. Given parameter values yield the nominal metric values. Deviations from these parameter values change the values of the metric respectively, with the metric exhibiting different sensitivities to deviations in different parameters. For example, for the illustrated extent of deviation, the metric is insensitive to parameter P2—as the metric does not change its value under the parameter deviation, while the metric is very sensitive to parameter P3—as the metric does not change its value under the parameter deviation. In case the metric is so sensitive to the parameter change that it reaches the spec values, a fundamental design change may be required and indicated by the system. FIG. 8 thus exemplifies the system's ability to finely analyze the different levels of sensitivities of different metrics to different changes in different parameters. The sensitivity analysis is then used to optimize design and measurement process.

Advantageously, system 100 and method 200 are configured to provide simulation output estimation of the metrology results as a function of input parameter uncertainty. System 100 and the methods aim at achieving sufficiently low uncertainty in the input data. System 100 and the methods may be configured to handle the design stage by defining an uncertainty threshold to characterize the design, rather than defining parameter values and metric values without clear understanding of their implications on the design.

In example embodiments, a segmentation methodology, i.e., methods of dividing large features into small segments and of determining the geometrical parameters of the segments and the interspaces, may be derived from the sensitivity analysis and be configured with respect to specific target parameters, process parameters and metrology parameters. A hierarchy of subdivisions of target features may be derived as an extension of the segmentation methodology. The segmentation methodology may relate to etch and spin effects and may be differentiated into cases of conformal and non-conformal layers.

The invention is not limited to those diagrams or to the corresponding descriptions. For example, flow need not move through each illustrated box or state, or in exactly the same order as illustrated and described.

Thus, it is seen that the objects of the present invention are efficiently obtained, although modifications and changes to the invention should be readily apparent to those having ordinary skill in the art, which modifications are intended to be within the spirit and scope of the invention as claimed. It also is understood that the foregoing description is illustrative of the present invention and should not be considered as limiting. Therefore, other embodiments of the present invention are possible without departing from the spirit and scope of the present invention as claimed.

What is claimed is:

1. A system for analyzing targets, comprising:
at least one of a metrology tool or a semiconductor process tool; and
one or more processors configured to execute a plurality of computer-readable instructions, wherein the plurality of computer-readable instructions is configured to cause the one or more processors to:
generate target data from at least one of a plurality of target parameters for a plurality of targets, a plurality of target metrology conditions for a plurality of metrology processes performable by the metrology tool, or a plurality of production processes performable by the semiconductor process tool;
simulate one or more metrology measurements of the plurality of targets from the target data via a metrology simulation device;
generate a plurality of metrics that quantify the one or more metrology measurements via the metrology simulation device;
derive one or more functional dependencies of the plurality of metrics on the plurality of target parameters via a sensitivity analysis device;
define one or more uncertainties of the plurality of target parameters with respect to the one or more functional dependencies via the sensitivity analysis device;
coarse-filter the plurality of targets according to the simulated one or more metrology measurements to determine one or more coarse-filtered targets;

rank the one or more coarse-filtered targets and the plurality of target metrology conditions with respect to the one or more metrology measurements via a target optimization device;

provide data corresponding to at least one of the one or more functional dependencies, the one or more uncertainties, or the one or more rankings to the at least one of the metrology tool or the semiconductor process tool; and configure at least one of the plurality of metrology processes of the metrology tool to characterize the one or more target metrology conditions or the plurality of production processes of the semiconductor process tool to generate a semiconductor device design based on the data corresponding to at least one of the one or more functional dependencies, the one or more uncertainties, or the one or more rankings.

2. The system of claim 1, wherein the plurality of computer-readable instructions is further configured to cause the one or more processors to:
generate one or more suggested changes to at least one of the plurality of target parameters via at least one of the sensitivity analysis device or the target optimization device.

3. The system of claim 1, wherein the plurality of computer-readable instructions is further configured to cause the one or more processors to:
perform stack and topography verification prior to target optimization to determine one or more process parameters with a predetermined level of influence on the plurality of metrics via the sensitivity analysis device.

4. The system of claim 1, wherein the plurality of computer-readable instructions is further configured to cause the one or more processors to:
eliminate insensitive process variation parameters prior to target optimization to enhance the simulation process via the sensitivity analysis device.

5. The system of claim 1, wherein the plurality of computer-readable instructions is further configured to cause the one or more processors to:
provide quantitative data on an impact of process variations on metrology performance via the sensitivity analysis device.

6. The system of claim 1, wherein the plurality of computer-readable instructions is further configured to cause the one or more processors to:
receive metrology data for a first metrology step via a feed forward loop; and
determine one or more metrology excursions during a subsequent metrology step via the sensitivity analysis device.

7. The system of claim 1, wherein the plurality of computer-readable instructions is further configured to cause the one or more processors to:
correlate one or more observed metrology metrics with a variation of a specific process parameter of the one or more process parameters via the sensitivity analysis device.

8. The system of claim 1, wherein the plurality of computer-readable instructions is further configured to cause the one or more processors to:
receive at least one or more plurality of target parameters for the plurality of targets, the plurality of target metrology conditions, or the plurality of production processes from the semiconductor process tool.

9. A method, comprising:
simulating one or more metrology measurements of a plurality of targets based on target data, wherein the target data is generated from at least one of a plurality of target parameters for the plurality of targets, a plurality of target metrology conditions for a plurality of metrology processes performable by a metrology tool, or a plurality of production processes performable by a semiconductor process tool;

generating a plurality of metrics to quantify the one or more metrology measurements;

deriving one or more functional dependencies of the plurality of metrics on the plurality of target parameters;

defining one or more uncertainties of the plurality of target parameters with respect to the one or more functional dependencies;

coarse-filtering the plurality of targets according to the simulated one or more metrology measurements to determine one or more coarse-filtered targets;

ranking the one or more coarse-filtered targets and the plurality of target metrology conditions with respect to the one or more metrology measurements via a target optimization device;

providing data corresponding to at least one of the one or more functional dependencies, the one or more uncertainties, or the one or more rankings to at least one of the metrology tool or the semiconductor process tool; and configuring at least one of the plurality of metrology processes of the metrology tool to characterize the one or more target metrology conditions or the plurality of production processes of the semiconductor process tool to generate a semiconductor device design based on the data corresponding to at least one of the one or more functional dependencies, or the one or more uncertainties, or the one or more rankings, wherein at least one of the simulating the one or more metrology measurements, the generating the plurality of metrics, the deriving the one or more functional dependencies, or the defining one or more uncertainties is carried out by at least one computer processor.

10. The method of claim 9, further comprising:
eliminating insensitive process variation parameters prior to the ranking of the at least one of the plurality of targets or the plurality of target metrology conditions to enhance the simulating the one or more metrology measurements.

11. The method of claim 9, further comprising:
providing quantitative data on an impact of process variations on metrology performance.

12. The method of claim 9, further comprising:
correlating one or more observed metrology metrics with a variation of a specific process parameter of the one or more process parameters.

13. The method of claim 9, further comprising:
generating one or more suggested changes to at least one of the plurality of target parameters.

14. The method of claim 9, further comprising:
defining one or more uncertainties of the plurality of target parameters with respect to the one or more functional dependencies.

15. The method of claim 9, further comprising:
receiving at least one or more plurality of target parameters for the plurality of targets, the plurality of target metrology conditions, or the plurality of production processes from the semiconductor process tool.

16. A apparatus to analyze targets, comprising:
a non-transitory memory element configured to store a plurality of computer-readable instructions; and
one or more processors configured to execute the plurality of computer-readable instructions, the plurality of computer-readable instructions is configured to cause the one or more processors to:
   simulate one or more metrology measurements of a plurality of targets based on target data, wherein the target data is generated from at least one of a plurality of target parameters for the plurality of targets, a plurality of target metrology conditions for a plurality of metrology processes performable by a metrology tool, or a plurality of production processes performable by a semiconductor process tool;
   generate a plurality of metrics to quantify the one or more metrology measurements;
   derive one or more functional dependencies of the plurality of metrics on the plurality of target parameters;
   define one or more uncertainties of the plurality of target parameters with respect to the one or more functional dependencies;
   coarse-filter the plurality of targets according to the simulated one or more metrology measurements to determine one or more coarse-filtered targets;
   rank the one or more coarse-filtered targets and the plurality of target metrology conditions with respect to the one or more metrology measurements via a target optimization device;
   provide data corresponding to at least one of the one or more functional dependencies or the one or more uncertainties to at least one of the metrology tool or the semiconductor process tool; and
   configure at least one of the plurality of metrology processes of the metrology tool to characterize the plurality of target metrology conditions or the plurality of production processes of the semiconductor process tool to generate a semiconductor device design based on the data corresponding to at least one of the one or more functional dependencies, the one or more uncertainties, or the one or more rankings.

17. The apparatus of claim 16, wherein the plurality of computer-readable instructions is further configured to cause the one or more processors to:
   receive at least one or more plurality of target parameters for the plurality of targets, the plurality of target metrology conditions, or the plurality of production processes from the semiconductor process tool.

* * * * *